United States Patent [19]
Johnson

[11] 3,965,431
[45] June 22, 1976

[54] CIRCUITRY FOR PRODUCING PULSES WITH PRECISE PREDETERMINED WIDTHS

[75] Inventor: Edgar A. Johnson, Tujunga, Calif.
[73] Assignee: The Singer Company, New York, N.Y.
[22] Filed: Jan. 2, 1975
[21] Appl. No.: 537,983

[52] U.S. Cl.................................. 328/58; 307/208; 306/265; 307/273; 328/63; 328/207
[51] Int. Cl.² .......................................... H03K 5/04
[58] Field of Search ........... 307/265, 208, 273, 269; 328/58, 63, 207

[56] References Cited
UNITED STATES PATENTS
3,781,573  12/1973  Weeden, Jr........................ 307/273
3,838,297   9/1974  Bardo et al. ....................... 307/265

*Primary Examiner*—Stanley D. Miller, Jr.
*Attorney, Agent, or Firm*—Edward L. Bell; Linval B. Castle; Joseph R. Dwyer

[57] ABSTRACT

Circuitry for generating pulses with extremely accurate widths. Clock signals, from a precision crystal controlled oscillator, control an input flip-flop which fires a one-shot multivibrator adjusted as closely as possible to the desired pulse width. The one-shot output is coupled to an output flip-flop controlled by the crystal controlled clock so that the width of the output pulse becomes an exact multiple of the clock period.

4 Claims, 3 Drawing Figures

CIRCUITRY FOR PRODUCING PULSES WITH PRECISE PREDETERMINED WIDTHS

In the development of certain electronic circuitry, it is often necessary to generate a pulse or train of pulses of a certain pulse width. Generally, the most satisfactory pulse generating circuitry includes a one-shot multivibrator designed to develop a pulse of the desired width when triggered by an input signal. If it is desired to generate an extremely accurate train of pulses such as those required for pulse counting discriminators or precision frequency-to-voltage converters, the one-shot multivibrator has been proven unsatisfactory because frequency variations in the input triggering signals have caused the multivibrators to misfire resulting in perturbations in the output pulse train. Therefore, in order to generate a pulse train with a repetition rate that follows the frequency variations of an input triggering signal, it has heretofore been necessary to develop very complex circuitry that may employ binary counters in place of the one-shot multivibrators. The counters are started by the input triggering signals and are coupled in a pulse generating circuitry so that the pulses are generated with widths corresponding to a predetermined number of pulses produced by a precision clock. In general, pulse generating circuitry employing binary counters are very complex and costly. Therefore, it would be most desirable to employ one-shot multivibrator circuits which include means for greatly improving the accuracy and stability of the generated pulse train.

Briefly described, the present invention is for circuitry including an RC one-shot multivibrator which produces extremely stable and accurate output pulses. The circuitry is controlled by an accurate crystal controlled high-frequency oscillator which clocks an input flip-flop that in turn, actuates the one-shot on the first down-going clock pulse after the input triggering signal. An output flip-flop coupled to the one-shot and responsive to the clock, produces an output pulse that remains high as long as the one-shot signal is high, and turns to its low state on the first down-going clock pulse after completion of the one-shot pulse. The output pulse width is therefore an exact multiple of the crystal controlled high-frequency clock.

In the drawings which illustrate the preferred embodiment of the invention.

Figure 1:
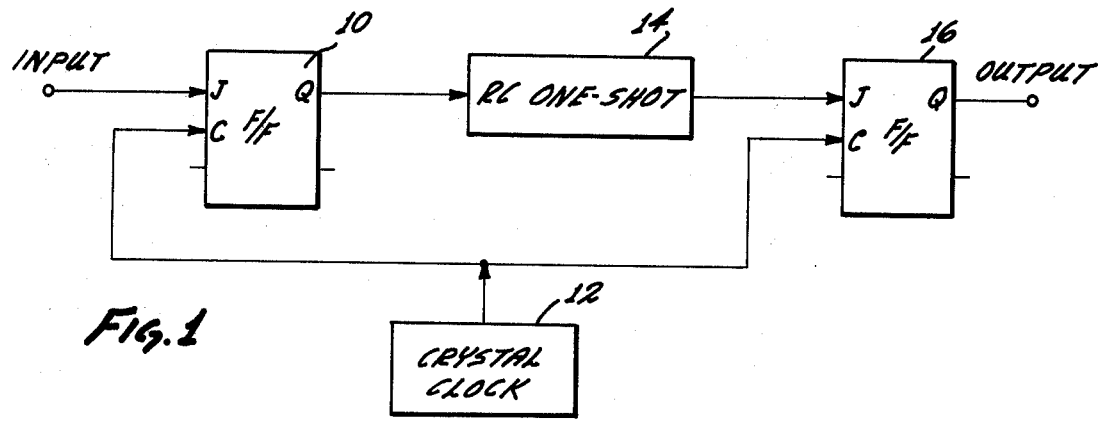
FIG. 1 is a simplified block diagram of the circuitry of the invention.

The basic principles of the invention can readily be understood from the inspection of the simplified block diagram illustrated in FIG. 1 of the drawings. In FIG. 1, a triggering signal is introduced into the input terminal and is applied to the J input of a JK flip-flop 10. A precision clock 12 generates signals which, for output accuracy, should be at a relatively high frequency of, for example, 10 MHz. The signals from clock 12 are applied to the clock input terminal of flip-flop 10 so that upon the first down-going clock signal after the arrival of the input signal, the flip-flop 10 will produce an output signal which is applied to the RC one-shot multivibrator 14. The one-shot 14 therefore responds not directly to the input signal but to the first down-going clock signal after arrival of the input signal. It can be seen therefore that the leading edge of the eventual output signal will correspond to the down-going pulse from the crystal clock 12.

RC one-shot 14 is adjusted as closely as possible to the desired pulse width, for example, four microseconds. Therefore, approximately 4 microseconds after the introduction of the input triggering signal, the output signal from one-shot multivibrator 14 will drop to its stable condition. The approximate 4 microsecond pulse from one-shot 14 is applied to the J input of a JK flip-flop 16 which is also under the control of the crystal clock 12. After the approximate 4 microsecond pulse from one-shot 14 drops to its stable state, flip-flop 16 produces an output signal that correspondingly drops upon the next down-going pulse of the crystal clock 12. It may be seen, therefore, that any small inaccuracies in the calibration of the one-shot 14 is corrected by the precisely calibrated crystal clock 12 and that the width of the output pulse is an exact multiple of the crystal control clock. If the crystal clock is operating at a frequency of 10 MHz and the RC one-shot is calibrated to produce a pulse of approximately a 4 microsecond width, then the width of the output pulse from the Q terminal of flip-flop 16 will be equal to 40 clock pulses or precisely 4 microseconds.

Figure 2:
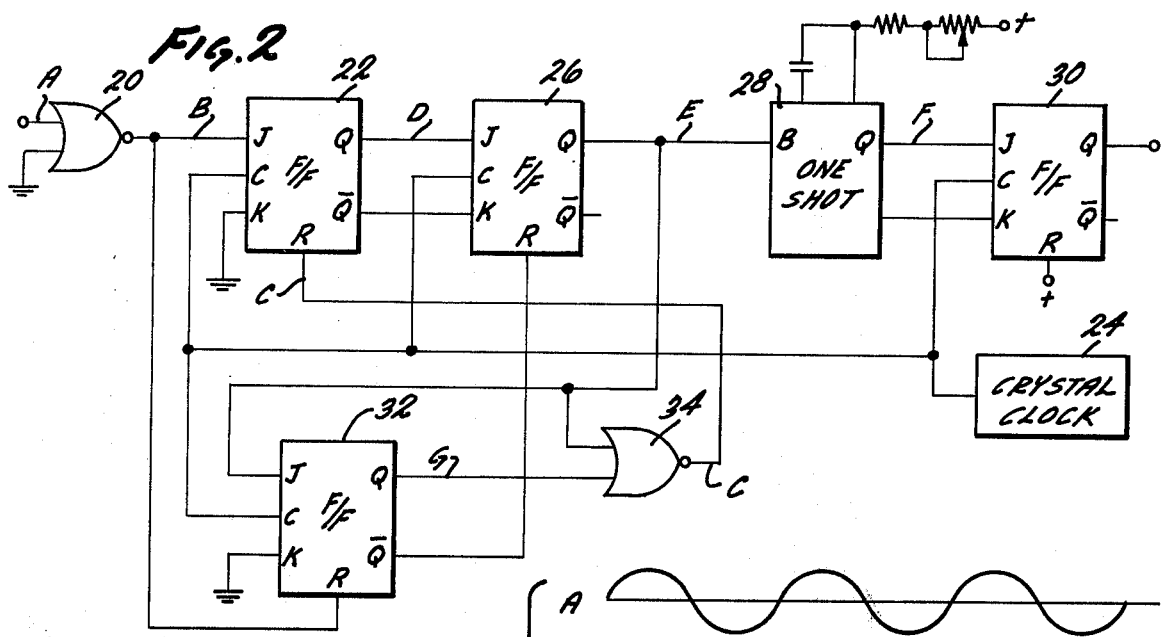
FIG. 2 is a complete block diagram of the circuitry of the invention.

FIG. 2 is an illustration of the complete block diagram of the circuitry embodying the invention. In the description of the embodiment shown in FIG. 2 and the various waveforms illustrated in FIG. 3, it will be assumed that it is desired to generate a train of precision output pulses at a pulse repetition rate of, for example, 100,000 pulses per second. Accordingly, a 100 kHz sine-wave triggering signal is applied to the input terminal of a NOR-gate 20 which produces a negative going output pulse at some predetermined threshold point on the sine-wave. The input triggering sine-wave signal is illustrated in waveform A of FIG. 3 and the output pulses of NOR-gate 20 is shown as waveform B. These reference letters are also illustrated at the appropriate points in the block diagram of FIG. 2. The signal B from NOR-gate 20 is applied to the J terminal of a JK flip-flop 22, the K terminal of which is grounded so that the flip-flop operates as a clocked latch. In this configuration, high signals at the J input and at the reset input, will load the flip-flop so that when the clock signal drops to its low state, the signal appearing at the J input is transferred to the output terminal Q which remains high during all subsequent clock pulses until it is driven to its low state only by a down-going reset pulse.

Figure 3:
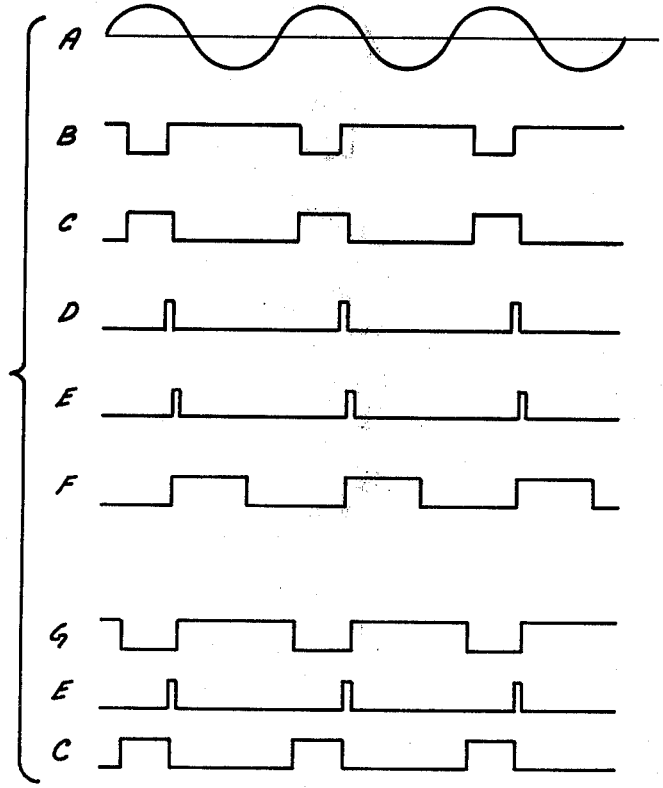
FIG. 3 is a series of waveforms of typical signals appearing at various points in the circuit of FIG. 2.

For high output accuracy, the precision clock should generate clock pulses at a frequency of approximately one hundred times that of the average input triggering signal. Therefore, crystal controlled clock 24 which in the preferred embodiment produces output signals at a frequency of 10 MHz is coupled to the clock input terminal of the flip-flop 22 and a reset circuit, which will be subsequently described, is coupled to apply a reset signal C, as illustrated in FIG. 3, to the reset terminal of flip-flop 22. Flip-flop 22 therefore produces a positive going output signal D at its Q terminal upon the occurrence of the first down-going clock pulse after the signals appearing at the J, clock, and reset terminals have been simultaneously high. The output signal D, which is illustrated in FIG. 3, is applied to the J input terminal of the JK flip-flop 26. The clock terminal of flip-flop 26 is coupled to the crystal controlled clock 24; the reset terminal is coupled to the reset circuitry to be subsequently described, and the K input terminal of flip-flop 26 is coupled to receive the signal appearing at the Q output terminal of flip-flop 22. The output signal E of flip-flop 26 therefore follows the output signal D of flip-flop 22 but at one clock pulse later, as shown in FIG. 3.

The output signal E of flip-flop 26 is applied to the input of one-shot multivibrator 28 which has been adjusted or constructed to produce an output pulse of a desired pulse width, for example, 4 microseconds. While one-shot multivibrators are generally quite accurate, their output pulses are not precise and are further effected by heat and other environmental conditions. Therefore, upon the occurrence of an input signal E, one-shot multivibrator 28 will produce an output signal F that is, in this example, substantially four microseconds in width. This output signal from multivibrator 28 is applied to the J terminal of an output flip-flop 30. Flip-flop 30 is coupled to receive the clock signals from crystal clock 24 and a positive voltage is applied to the reset terminal so that flip-flop 30 will produce at its output a signal that goes to its high state upon the occurrence of the first down-going clock pulse after the input signal to the J terminal goes high, and produces a negative going output signal at the Q terminal upon the occurrence of the first down-going clock pulse after the input signal to the J terminal goes low.

The reset circuitry previously referred to includes a JK flip-flop 32 having its J input terminal coupled to receive the output signal E from flip-flop 26. The clock input terminal of flip-flop 32 is coupled to the crystal clock 24 and the reset terminal is coupled to receive the signal B from NOR-gate 20. The K input terminal of the flip-flop 32 is grounded so that the flip-flop acts as a clock latch similar to the operation of the flip-flop 22. The output signal G of the flip-flop 22 will switch to a high state upon the occurrence of the first down-going clock pulse after its J input, reset, and clock signals have all gone to the high state. The output signal G will remain high until its reset signal B returns to the low state as illustrated in FIG 3. The output terminal Q of flip-flop 32 is coupled to one input of a NOR-gate 34, the other input terminal which is coupled to the Q output of flip-flop 26 to receive the output signal E which, for convenience, has been duplicated below waveform G in FIG. 3. Thus, when signals G and E are both in the low state, NOR-gate 34 will produce an output signal C which becomes the reset signal for flip-flop 22.

What is claimed is:

1. Circuitry for generating a pulse of precise predetermined width in response to an input signal comprising:
    a clock-pulse generator;
    a one-shot multivibrator, said multivibrator being adjustable to approximately the desired predetermined pulse width;
    input means coupled to said generator and to said multivibrator, said input means being responsive to an input trigger signal for applying an actuating pulse to said multivibrator upon the occurrence of the first clock pulse after receipt of said triggering signal; and
    output means coupled to said clock pulse generator and to said multivibrator for generating an output pulse that initiates upon the occurrence of said multivibrator actuating pulse and which terminates upon the occurrence of the first clock pulse after completion of said multivibrator pulse.

2. The circuitry claimed in claim 1 wherein said one-shot multivibrator is a resistance coupled multivibrator.

3. The circuitry claimed in claim 1 wherein said input means includes a JK flip-flop with a grounded K input terminal.

4. The circuitry claimed in claim 1 wherein said clock pulse generator produces pulses at a frequency of approximately 100 times the frequency of said input triggering signal.

* * * * *